United States Patent
Smith

(10) Patent No.: US 6,331,941 B1
(45) Date of Patent: Dec. 18, 2001

(54) SHORT CIRCUIT DETECTION METHOD AND APPARATUS AND MOTOR DRIVE INCORPORATING SAME

(75) Inventor: David Smith, Roanoke, VA (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 09/620,994

(22) Filed: Jul. 20, 2000

Related U.S. Application Data

(60) Provisional application No. 60/144,874, filed on Jul. 20, 1999.

(51) Int. Cl.[7] ............... H02M 5/45; H02M 7/5387; H02H 7/06
(52) U.S. Cl. ............... 363/37; 363/132; 318/434
(58) Field of Search ............... 363/17, 20, 37, 363/132, 40, 41, 137, 138, 96; 318/434, 803; 361/20, 85, 93

(56) References Cited

U.S. PATENT DOCUMENTS

| | | | |
|---|---|---|---|
| 4,720,776 | * | 1/1988 | Guyeska et al. .............. 363/37 |
| 5,631,813 | * | 5/1997 | Ikeshita .................. 363/37 |

FOREIGN PATENT DOCUMENTS

WO 90/07813    7/1990    (WO) ............. H02H/7/122

* cited by examiner

*Primary Examiner*—Rajnikant B. Patel
(74) *Attorney, Agent, or Firm*—Hunton & Williams; Carl B. Horton, Esq.; Kevin T. Duncan, Esq.

(57) ABSTRACT

An apparatus and method for detecting short circuits in a power conversion circuit and a motor drive incorporating the same. The circuit is gated and subsequently a DC bus charger is activated. Charge on the DC bus is measured to indicate a short circuit. After a test iteration, a protective circuit is activated to discharge the DC bus to permit another test iteration to be accomplished quickly.

31 Claims, 3 Drawing Sheets

SHORT CIRCUIT DETECTION METHOD AND APPARATUS AND MOTOR DRIVE INCORPORATING SAME

RELATED APPLICATION DATA

This application claims benefit of Provisional Application Serial No. 60/144,874 filed Jul. 20, 1999.

BACKGROUND OF THE INVENTION

The invention relates generally to the detection of shorts in various electrical circuits and more particularly to a method and apparatus for detecting shorts with a lower risk of damaging the circuits during a detection procedure.

It is often desirable to test power conversion circuits for integrity. Generally, a "power conversion circuit" refers to any circuit that renders a change in electrical power, such as a step-up transformer, a step-down transformer, an inverter, a rectifier, a switching bridge, or the like. Power conversion circuits find applications in many devices, such as AC motor drives for example. Typically in an AC motor drive, three phase AC power is converted to DC power and conversion circuits, such as bridges, are coupled between positive and negative DC buses. The conversion circuits are operated in a predetermined manner to generate a reasonable facsimile of AC power having the desired voltage and frequency using various techniques, such as pulse width modulation. Many power conversion circuits comprise complex semiconductor circuits that must be manufactured under very precise conditions and are subject to defects or failure due to overloading.

Of particular importance in many power conversion circuits is avoidance of shorts. Of course, shorts may cause the power conversion device to malfunction. Further, shorts in power conversion devices can cause damage to other components coupled to the power conversion device, such as motors, and may even cause physical harm to nearby personnel due to electrical shock or explosion. Accordingly, power conversion circuits and other electrical circuits are often subjected to short circuit test procedures after assembly.

It is known to accomplish short circuit testing of power conversion circuits by charging the DC bus and subsequently firing the gates of the circuit elements of interest in sequence while observing for symptoms of a short. However, this procedure has disadvantages. First, the timing of firing the various gates must be executed precisely or the results of the test procedure will not be accurate. It is difficult in a practical sense to achieve the required timing precision. Second, if the DC bus is charged beyond a relatively low level when the gates are fired, the bus capacitors will discharge at a very high current level, often in excess of the ratings of the circuit elements such as integrated gate commutated thyristors (IGCTs). Of course, such currents can damage the circuit elements. For these reasons, the short circuit test procedure described above is difficult to apply and often destructive.

BRIEF SUMMARY OF THE INVENTION

A first aspect of the invention is a method of testing an electrical circuit between two DC buses for shorts, comprising the steps of gating selected elements of the circuit, activating a DC bus charger coupled to the DC buses while the circuit is gated, detecting a level of charge of the DC buses over time as a result of the activating step to determine if the circuit is shorted, and discharging the DC buses after the detecting step.

A second aspect of the invention is an apparatus for testing an electrical circuit between two DC buses for shorts, comprising means for gating selected elements of the circuit, means for activating a DC bus charger while the circuit is gated, means for detecting a level of charge of the DC buses over time as a result of the DC bus charger to determine if the circuit is shorted, and means for selectively discharging the DC buses.

A third aspect of the invention is a short circuit test cell comprising a positive DC bus, a negative DC bus, a neutral DC bus, an electrical circuit connected between the positive DC bus and the negative DC bus, a DC bus charger coupled to the positive DC bus and the negative DC bus, a discharge circuit coupled to the positive DC bus and the negative DC bus, the discharge circuit including a switch coupled between the positive DC bus and the neutral DC bus and a switch coupled between the negative DC bus and the neutral DC bus, and a controller operatively coupled to the electrical circuit, the DC bus charger, and the discharge circuit. The controller is operative to selectively gate the electrical circuit, operate the DC bus charger, and detect a charge on the DC bus in response to activation of the DC bus charger. The controller also is operative to activate the discharge circuit to discharge the DC bus between gating operations.

A fourth aspect of the invention is an AC motor drive comprising, a converter section, a positive DC bus, a negative DC bus, a neutral DC bus, an inverter section having bridges connected between the positive DC bus and the negative DC bus, a DC bus charger coupled to the positive DC bus and a controller operatively coupled to the bridges, the DC bus charger, and the discharge circuit. The controller is operative to selectively gate the bridges, operate the DC bus charger, and detect a charge on the DC bus in response to activation of the DC bus charger. The controller also is operative to activate the discharge circuit to discharge the DC bus between gating operations.

BRIEF DESCRIPTION OF THE DRAWINGS

The invention is described through a preferred embodiment and the attached drawing in which.

DETAILED DESCRIPTION OF THE INVENTION

Figure 1:
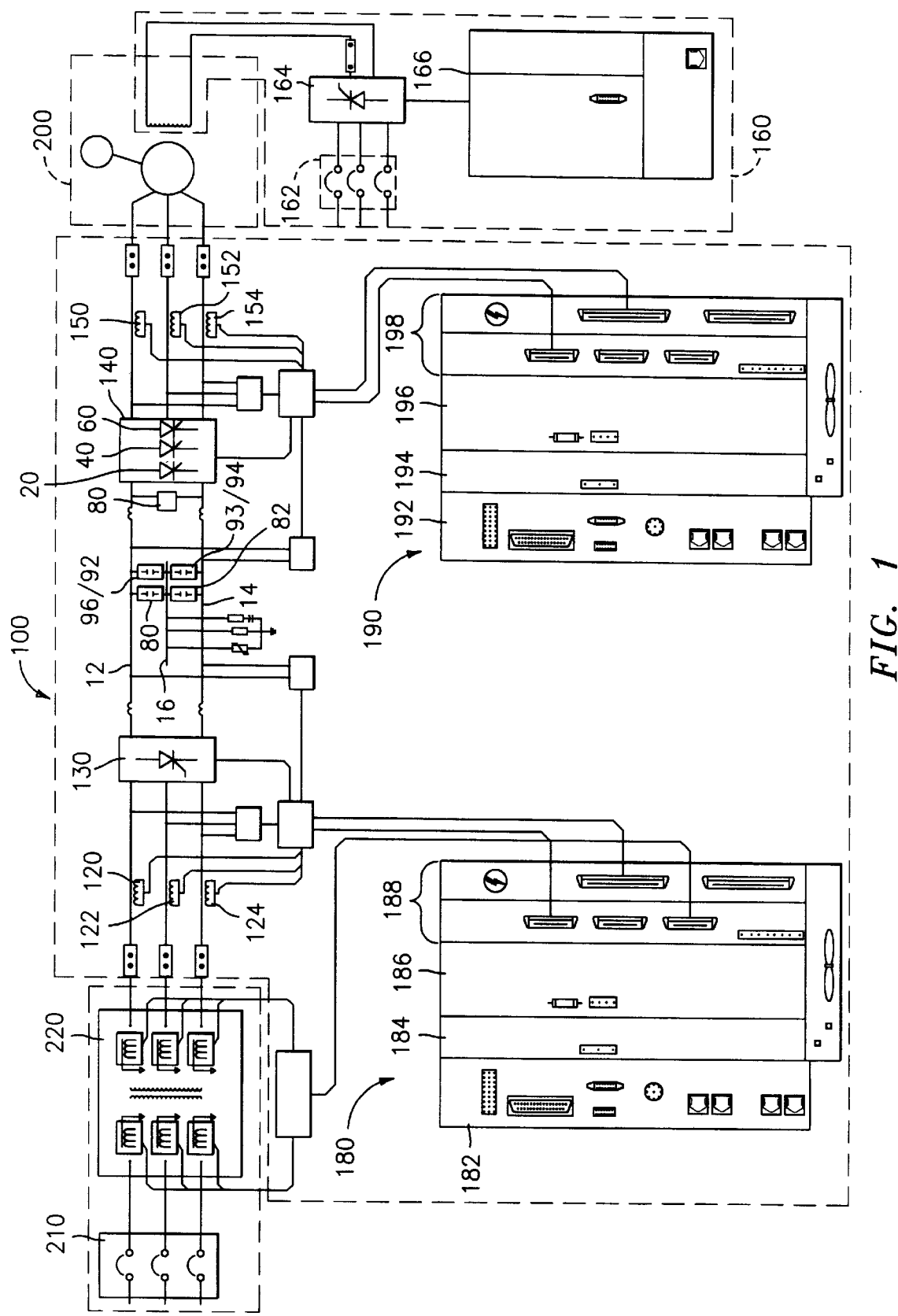
FIG. 1 is a black diagram of a motor drive incorporating a test cell in accordance with the preferred embodiment.

FIG. 1 illustrates motor drive 100 in which the preferred embodiment is implemented. Motor drive 100 is a variable speed AC motor drive, such as that sold under the tradename Innovation Series™ by the General Electric Company. Motor drive 100 has converter section 130 for converting a three phase AC signal, coming from an unillustrated power supply via switchgear 210 and transformer 220, into a DC voltage. Converter section 130 includes active or passive elements for converting the three phase input voltage to a DC voltage in a known manner under control of converter controller 180 described in detail below. Converter section 130 is coupled, on its output side, to positive DC bus 12 and negative DC bus 14. Positive DC bus 12 and negative DC bus 14 are coupled to neutral DC bus 16 by link capacitors 80 and 82 respectively, as shown in detail in FIG. 2.

Motor drive 100 also includes inverter section 140 including bridges 20, 40 and 60, as described in detail below.

Inverter section 140 serves to generate a variable frequency three phase AC signal, or an approximation thereof, using known techniques (pulse width modulation for example) under control of inverter controller 190 described in detail below. The three phase AC output of inverter section 140 is coupled to AC motor 200. AC motor 200 can be an induction motor or a synchronous motor. In the case of a synchronous motor, field exciter 160, including field controller 166, switchgear 162, and converter circuitry 164, is coupled to motor 200 to supply DC current to the field winding of motor 200 in a known manner. In the case of an induction motor, field exciter 160 is omitted.

Converter controller 180 includes communication section 182 having various known communication ports for coupling motor drive 100 to a communications network or other logic devices, I/O section 184 having various outputs, such as relay contacts, analog outputs, and the like, for coupling drive 100 to other devices in a known manner, power supply section 186, and logic section 188 including a central processing unit (CPU) for accomplishing the control logic for converter section 130. Similarly inverter controller 190 includes communication section 192 having various known communication ports for coupling motor drive 100 to a communications network or other logic devices, I/O section 194 having various outputs, such as relay contacts, analog outputs, and the like, for coupling drive 100 to other devices in a known manner, power supply section 196, and logic section 198 including a central processing unit (CPU) for accomplishing the control logic for inverter section 140. While converter controller 180 and inverter controller 190 are separate elements in the preferred embodiment, one controller could be used to control both converter 130 and inverter 140. The controllers can be conventional microprocessor based devices, such as personal computers, programmable logic controllers, or other general purpose or dedicated controllers. Hall effect transducers 120, 122, and 124 provide a feedback signal indicative of the input current of drive 100 to converter controller 180 and Hall effect transducers 150, 152, and 154 provide a feedback signal indicative of the output current of drive 100 to inverter controller 190.

Figure 2:
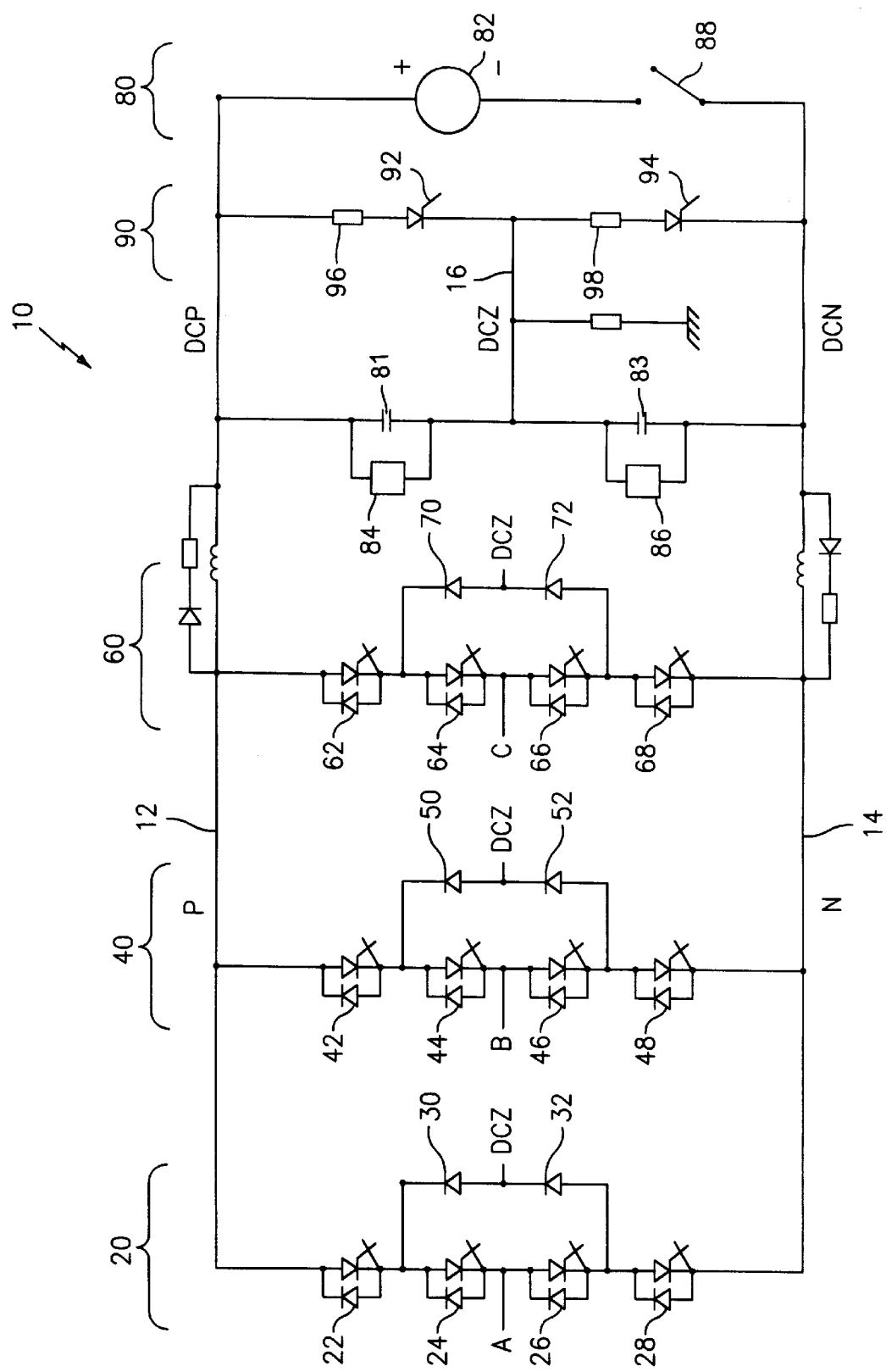
FIG. 2 is a schematic illustration of the test cell of the preferred embodiment.

FIG. 2 illustrates test cell 10 of a preferred embodiment of the invention. Test cell 10 is constituted of portions of drive 100 and includes three bridges 20, 40, and 60 of inverter section 140, one for each of phases A, B, and C of a three phase AC output voltage signal. Bridge 20 includes switches 22, 24, 26, and 28 (IGCTs, for example) coupled in series between positive DC bus 12, and negative DC bus 14. Bridge 20 also includes neutral clamping diodes 30 and 32 coupled to DC neutral bus 16 as illustrated. During operation of drive 100, IGCT switches 22, 24, 26, and 28 are selectively gated, i.e. placed in the "on", or conducting state, under control of inverter controller 190 in a sequence to generate a phase A AC voltage signal at the point labeled A in a known manner. Bridge 40 includes switches 42, 44, 46, and 48 coupled in series between positive DC bus 12, and negative DC bus 14. Bridge 40 also includes neutral clamping diodes 50 and 52 coupled to DC neutral bus 16 as illustrated. During operation of the motor drive, switches 42, 44, 46, and 48 are selectively gated under control of converter controller 190 in sequence to generate a phase B AC voltage signal at the point labeled B in a known manner. Bridge 60 includes IGCT switches 62, 64, 66, and 68 coupled in series between positive DC bus 12, and negative DC bus 14. Bridge 40 also includes neutral clamping diodes 70 and 72 coupled to DC neutral bus 16 as illustrated. During operation of the motor drive, switches 62, 64, 66, and 68 are selectively gated under control of converter controller 190 in sequence to generate a phase C voltage signal at the point labeled C in a known manner.

Test cell 10 also includes DC link capacitor 81, coupled between positive DC bus 12 and neutral DC bus 16, and DC link capacitor 83 coupled between negative DC bus 14 and neutral DC bus 16. Bleed resistors 84 and 86 are coupled in parallel with capacitors 81 and 83 respectively as illustrated. Test cell 10 also includes DC bus charger 80 and discharge circuit 90. DC bus charger 80 includes DC power supply 82 and switch 88. When switch 88 is closed to activate bus charger 80, power supply 82 charges positive DC bus 12 and negative DC bus 14 by creating a predetermined voltage potential between positive DC bus 12 and negative DC bus 14. Of course, charging of positive DC bus 12 results in a potential across plates of link capacitor 81 and charging of negative DC bus 14 results in potential across the plates of link capacitor 83. Discharge circuit 90 includes switching elements 92 and 94 (triacs or relay contacts for example) and associated resistors 96 and 98 as illustrated to limit discharge currents during a discharge operation.

Figure 3:
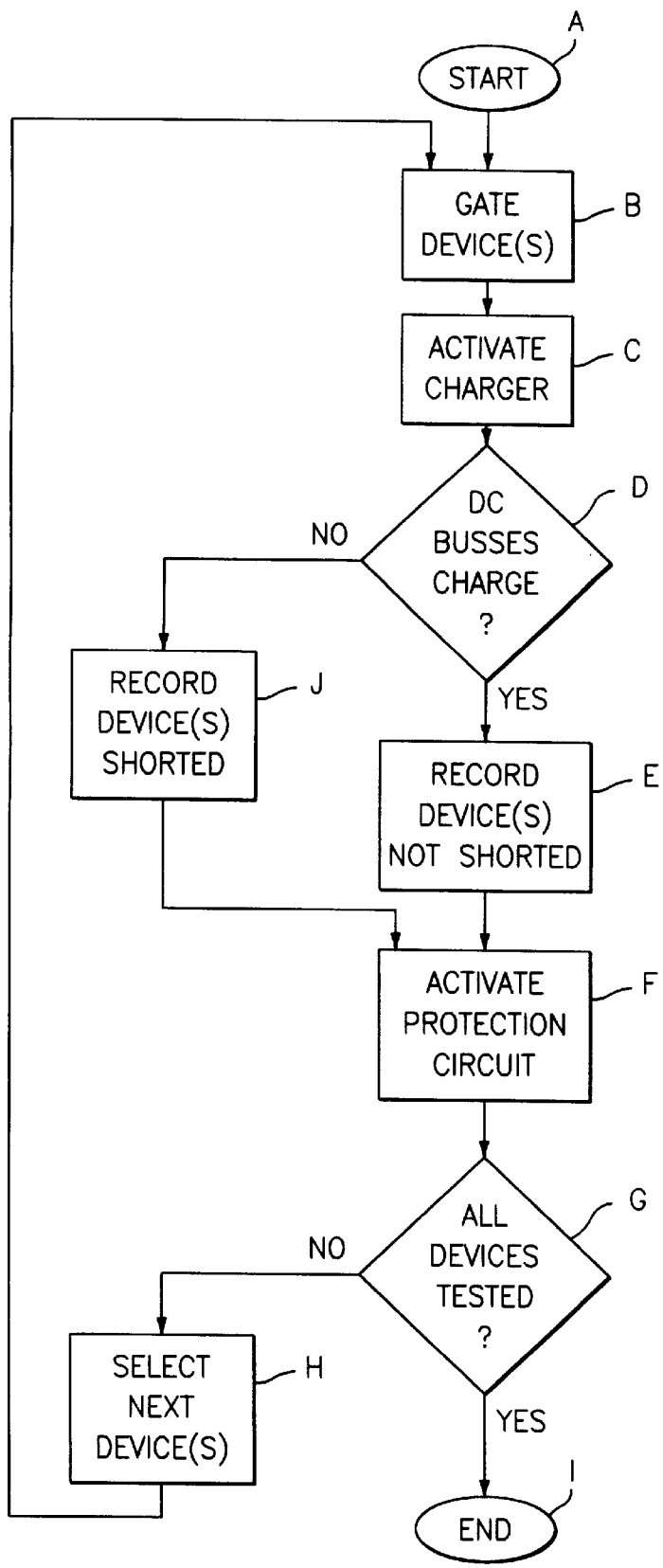
FIG. 3 is a flow chart of a test procedure in accordance with the preferred embodiment.

Occasionally, it may be desirable to conduct diagnostics on drive 100. For example, at startup or after a failure and repair, certain diagnostics may be accomplished automatically. One of the diagnostics is a short circuit test of bridges 20, 40, and 60. A short circuit test procedure of the preferred embodiment is described below with reference to the flowchart of FIG. 3. The procedure will be discussed in detail with respect to bridge 20 only. However, it is clear that the procedure can be accomplished simultaneously for each bridge, i.e. phase, or in seriatim for each bridge. Corresponding elements for each phase can be controlled in a manner similar to the elements of bridge 20 described below. The short circuit test procedure begins in step A upon startup or another event of motor drive 100. In step B, inverter controller 190, operating in accordance with a control program stored in a memory thereof, gates switches 22 and 24, i.e. places bridge 20 in a positive state. In step C, inverter controller 190 activates DC bus charger 80 to begin charging positive DC bus 12 and negative DC 14. In this state, bridge 20 should isolate positive DC bus 12 from neutral DC bus 16 and should isolate negative DC bus 14 from neutral DC bus 16. Accordingly, both positive DC bus 12 and negative DC bus 14 should charge. The change can be detected by measuring the charge building up on link capacitors 81 and 83 in step D. Any known mechanism for measuring charge directly or indirectly can be used. In such a case, switch 26 is recorded, in a memory device of inverter controller 190 for example, as being not shorted in step F. However, if switch 26 is shorted, a conduction path between positive DC bus 12 and neutral DC bus 16 will be present via gated switches 22, 24, shorted switch 26, and diode 32. Accordingly, in the case of switch 26 being shorted, there will be no charge building, or inadequate charge up, on capacitor 81 and the shorted status of switch 26 will be recorded in step J. In either case, the procedure returns to step F where charger 80 is turned off and discharge circuit 90 is activated, i.e. switches 92 and 94 are gated to quickly discharge the DC bus. Without discharge circuit 90, it could take several minutes or more to discharge positive DC bus 12 and negative DC bus 14. In step G it is determined if all devices have been tested. If so, the procedure ends in step I. If all of the devices have not been tested, the procedure continues to step H.

At this time, switches 24 and 26 are selected in step H and the procedure returns to step B in which the selected switches are gated, i.e. bridge 20 is placed in a zero state. In step C, inverter controller 190 activates DC bus charger 80 to once again begin charging positive DC bus 12 and negative DC 14. In this state, bridge 20 should isolate positive DC bus 12 from neutral DC bus 16 isolate negative DC bus 14 from neutral DC bus 16 and thus charge should build up on link capacitors 81 and 83 in step D. In such a case switch 22 will be recorded as not shorted in step E. However, in the event that switch 22 is shorted, there will be a conduction path between positive DC bus 12 and neutral DC bus 16 via shorted switch 22, gated switches 24, 26, and diode 32. Accordingly, inadequate charge will build up on link capacitor 81 in step D and switch 22 will be recorded as being shorted in step J. In either case, the procedure returns to step F where charger 80 is turned off and discharge circuit 90 is activated, i.e. switches 92 and 94 are gated to quickly discharge positive DC bus 12 and negative DC bus 14. In step G it is determined if all devices have been tested. If so, the procedure ends in step I. If all of the devices have not been tested, the procedure continues to step H.

At this time, switches 26 and 28 are selected in step H and gated, i.e. bridge 20 is placed in a negative state, in step B. In step C, inverter controller 190 activates DC bus charger 80 to once again begin charging positive DC bus 12 and negative DC 14. In this state, bridge 20 should isolate positive DC bus 12 from neutral DC bus 16 and thus charge should build up on link capacitor 81 in step D and switches 22 and 24 will be recorded as not shorted in step E. However, in the event that switches 22 and 24 are shorted or only switch 22 is shorted, there will be a conduction path between positive DC bus 12 and neutral DC bus 16. Accordingly, inadequate charge will build up on link capacitor 80 in step D and switches 22 and 24 are recorded as being shorted in step J. In either case, the procedure returns to step F where charger 80 is turned off and discharge circuit 90 is activated, i.e. switches 92 and 94 are gated to quickly discharge the DC bus. In step G it is determined if all devices have been tested. If so, the procedure ends in step I. If all of the devices have not been tested, the procedure continues to step H.

In the first iteration of the procedure described above, switch 26 is tested for a shorts. In the second iteration, switch 22 is tested for a short. In the third iteration, switches 22 and 24 are tested for a short. Also, note that a short of switch 28 would cause negative DC bus 14 to fail to charge adequately during each iteration. Accordingly, logic can be used to determine the short circuit status of each switch 22, 24, 26, and 28 based on the results recorded during each iteration. It may be preferable to perform the test procedure simultaneously on each bridge 20, 40, and 60. In the event that a short circuit is detected, the procedure can be accomplished individually on each of bridges 20, 40, and 60 to determine which bridge the short circuit is in. Various other gating combinations can be accomplished to detect short circuits in a desired manner.

In the preferred embodiment, switches are gated prior to activating a bus charger. Accordingly, high discharge currents are avoided even when there is a short circuit. Also, the bus is discharged quickly by a discharge circuit between each iteration of a short circuit test procedures to accomplish the test procedure quickly and reliably. The switches can be of any type, such as triacs, relays, silicon controlled rectifiers (SCRs), IGCTs, power transistors, and the like. The bridges can include any appropriate components for accomplishing the desired power conversion and can be incorporated into various devices, such as motor drives, motor starters, transformers, and the like. The gating sequence can be accomplished in any manner depending on the particular circuit being tested. The test procedure can be initiated manually or in response to any event.

While the foregoing description includes many details and specificities, it is to be understood that these have been included for purposes of explanation only, and are not to be interpreted as limitations of the present invention. Many modifications to the embodiments described above can be made without departing from the spirit and scope of the invention, as is intended to be encompassed by the following claims and their legal equivalents.

What is claimed is:

1. A method of testing an electrical circuit between at least two DC buses for shorts, said method comprising the steps of:
   gating selected elements of the circuit;
   activating a DC bus charger coupled to the DC buses while the circuit is gated;
   detecting a first level of charge of the DC buses;
   detecting a second level of charge of the DC buses;
   comparing the first level of charge with the second level of charge to detect a charge difference over time and determine whether the circuit is shorted; and
   discharging the DC buses after said detecting step.

2. A method as recited in claim 1, wherein said discharging step comprises creating a conduction path between the DC buses.

3. A method as recited in claim 2, wherein the circuit comprises plural switches as elements and said gating step comprises selectively gating the switches in a predetermined manner.

4. A method as recited in claim 2, wherein the circuit comprises three bridges, one for each phase of a three phase power conversion circuit, each of the bridges comprising plural switches as elements, and wherein said gating step comprises gating corresponding switches in each of the three bridges simultaneously in a predetermined manner.

5. A method as recited in claim 2, wherein the circuit comprises three bridges, one for each phase of a three phase power conversion circuit, each of the bridges comprising plural switches as elements, and wherein said gating step comprises gating switches of the three bridges in seriatim.

6. A method as recited in claim 4, wherein plural iterations of said steps of gating, activating, detecting, comparing, and discharging are performed to isolate any shorts in the bridges.

7. A method as recited in claim 5, wherein plural iterations of said steps of gating, activating, detecting, comparing, and discharging are performed to isolate any shorts in the bridges.

8. A method as recited in claim 4, wherein the bridges each comprise first and second switches coupled in series between a positive DC bus and a phase output of the power conversion circuit, third and fourth switches coupled in series between a negative DC bus and the phase output of the power conversion circuit, and a series connection of two diodes, the series connection being coupled in parallel with the second and third switches and a neutral DC bus being coupled to a connection point of the two diodes.

9. A method as recited in claim 8, wherein the first switch, the second switch, the third switch, and the fourth switch each comprise an integrated gate commutated thyristor.

10. An apparatus for testing an electrical circuit between at least two DC buses for shorts, said apparatus comprising:
    means for gating selected elements of the circuit;
    means for activating a DC bus charger while the circuit is gated;

means for detecting a first level of charge of the DC buses and a second level of charge of the DC buses;

means for comparing the first level of charge with the second level of charge to detect a charge difference over time and determine whether the circuit is shorted; and means for selectively discharging the DC buses.

11. An apparatus as recited in claim 10, wherein the circuit comprises plural switches as elements and said means for gating comprises means for selectively gating selected ones of the switches in a predetermined manner.

12. An apparatus as recited in claim 10, wherein the circuit comprises three bridges, one for each phase of a three phase power conversion circuit, each of the bridges comprising plural switches, and wherein said means for gating comprises means for gating corresponding ones of the switches in each of the three bridges simultaneously.

13. An apparatus as recited in claim 10, wherein the circuit comprises three bridges, one for each phase of a three phase power conversion circuit, each of the bridges comprising plural switches, and wherein said means for gating comprises means for gating selected ones of the switches in the three bridges in seriatim.

14. An apparatus as recited in claim 13, wherein the bridges each comprise first and second switches coupled in series between a positive DC bus and a phase output of the power conversion circuit, third and fourth switches coupled in series between a negative DC bus and the phase output of the power conversion circuit, and a series connection of two diodes, the series connection being coupled in parallel with the second and third switches, and a neutral DC bus being coupled to a connection point of the two diodes.

15. An apparatus as recited in claim 14, wherein the first switch, the second switch, the third switch, and the fourth switch each comprise an integrated gate commutated thyristor.

16. A short circuit test cell comprising:
a positive DC bus;
a negative DC bus;
a neutral DC bus;
an electrical circuit connected between said positive DC bus and said negative DC bus;
a DC bus charger coupled to said positive DC bus and said negative DC bus;
a discharge circuit coupled to said positive DC bus and said negative DC bus; and
a controller operatively coupled to said electrical circuit, said DC bus charger, and said discharge circuit, said controller being operative to selectively gate said electrical circuit, operate said DC bus charger, detect a first charge on said positive DC bus and said negative DC bus in response to activation of said DC bus charger, detect a second charge on said positive DC bus and said negative DC bus in response to activation of said DC bus charger, and compare the first level of charge with the second level of charge to detect a charge difference over time and determine whether the circuit is shorted, said controller also being operative to activate said discharge circuit to discharge said positive DC bus and said negative DC bus between gating operations.

17. An apparatus as recited in claim 16 wherein, said discharge circuit includes a switch coupled between said positive DC bus and said neutral DC bus and a switch coupled between said negative DC bus and said neutral DC bus.

18. An apparatus as recited in claim 16, wherein said circuit comprises plural switches and said controller is operative to selectively gate the switches in a predetermined manner.

19. An apparatus as recited in claim 16, wherein said circuit comprises three bridges, one for each phase of a three phase power conversion circuit, each of said bridges comprising plural switches, and wherein said controller is operative to gate selected ones of said switches in each of said three bridges simultaneously.

20. An apparatus as recited in claim 16, wherein said circuit comprises three bridges, one for each phase of a three phase power conversion circuit, each of said bridges comprising plural switches, and wherein said controller is operative to gate corresponding ones of said switches in each of said three bridges in seriatim.

21. An apparatus as recited in claim 16, wherein said circuit comprises three bridges, each of said bridges comprising first and second switches coupled in series between said positive DC bus and a phase output of a power conversion circuit, third and fourth switches coupled in series between said negative DC bus and a phase output of the power conversion circuit, and a series connection of two diodes, the series connection being coupled in parallel with the second and third switches, and said neutral DC bus being coupled to a connection point of said two diodes.

22. An apparatus as recited in claim 21, wherein said first switch, said second switch, said third switch, and said fourth switch each comprise an integrated gate commutated thyristor.

23. An AC motor drive comprising:
a converter section;
a positive DC bus;
a negative DC bus;
a neutral DC bus;
an inverter section having bridges connected between said positive DC bus and said negative DC bus;
a DC bus charger coupled to said positive DC bus and said negative DC bus;
a discharge circuit coupled to said positive DC bus and said negative DC bus; and
a controller operatively coupled to said switching bridges, said DC bus charger, and said discharge circuit, said controller being operative to selectively gate said bridges, operate said DC bus charger, detect a first level of charge on said positive DC bus and said negative DC bus in response to activation of said DC bus charger, detect a second level of charge on said positive DC bus and said negative DC bus in response to activation of said DC bus charger, and compare said first level of charge with said second level of charge to detect a charge difference over time and determine whether said circuit is shorted, said controller also being operative to activate said discharge circuit to discharge said positive DC bus and said negative DC bus between gating operations.

24. An AC motor drive as recited in claim 23, wherein said discharge circuit includes a switch coupled between said positive DC bus and said neutral DC bus and a switch coupled between said negative DC bus and said neutral DC bus.

25. An AC motor drive as recited in claim 23, wherein said bridges comprise plural switches and said controller is operative to selectively gate said switches in a predetermined manner.

26. An AC motor drive as recited in claim 23, wherein there are three of said bridges, one for each of three phases, each of said bridges comprising plural switches, and wherein said controller is operative to gate selected ones of said switches in each of said three bridges simultaneously.

27. An AC motor drive as recited in claim 23, wherein there are three of said bridges, one for each of three phases, each of said switching bridges comprising plural switches, and wherein said controller is operative to gate corresponding ones of said switches in each of said three bridges in seriatim.

28. An AC motor drive as recited in claim 23, wherein said bridges each comprise first and second switches coupled in series between said positive DC bus and a phase output of a power conversion circuit, third and fourth switches coupled in series between said negative DC bus and the phase output of the power conversion circuit, and a series connection of two diodes, the series connection being coupled in parallel with the second and third switches, and said neutral DC bus being coupled to a connection point of said two diodes.

29. An apparatus as recited in claim 28, wherein said first switch, said second switch, said third switch, and said fourth switch each comprise an integrated gate commutated thyristor.

30. The method as recited in claim 1, wherein the steps of gating, detecting, comparing, and discharging are performed by an inverter controller.

31. The apparatus as recited in claim 10, wherein the means for gating, means for activating, means for detecting, means for comparing, and means for discharging are controlled by an inverter controller.

\* \* \* \* \*